United States Patent
Kim et al.

(10) Patent No.: US 7,374,966 B2
(45) Date of Patent: May 20, 2008

(54) APPARATUS FOR STACKING SEMICONDUCTOR CHIPS, METHOD FOR MANUFACTURING SEMICONDUCTOR PACKAGE USING THE SAME AND SEMICONDUCTOR PACKAGE MANUFACTURED THEREBY

(75) Inventors: Min-Ill Kim, Gyeonggi-do (KR); Dong-Kuk Kim, Gyeonggi-do (KR); Chang-Cheol Lee, Chungcheongnam-do (KR); Tae-Hoe Hwang, Chungcheongnam-do (KR); Jae-Young Hong, Chungcheongnam-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/534,924

(22) Filed: Sep. 25, 2006

(65) Prior Publication Data
US 2007/0018295 A1    Jan. 25, 2007

Related U.S. Application Data

(62) Division of application No. 10/916,094, filed on Aug. 10, 2004, now Pat. No. 7,135,353.

(30) Foreign Application Priority Data
Sep. 9, 2003    (KR) .............................. 2003-63132

(51) Int. Cl.
*H01L 21/00* (2006.01)
(52) U.S. Cl. ........................ 438/107; 156/564
(58) Field of Classification Search ........ 156/556, 156/563, 564, 571, 572; 438/107, 110
See application file for complete search history.

(56) References Cited

U.S. PATENT DOCUMENTS 5,765,277 A * 6/1998 Jin et al. .................... 29/743

(Continued)

FOREIGN PATENT DOCUMENTS

JP    2000-188369    7/2000

(Continued)

OTHER PUBLICATIONS

English language abstract of Korean Publication No. 1998-034801.

(Continued)

*Primary Examiner*—S. V. Clark
(74) *Attorney, Agent, or Firm*—Marger Johnson & McCollom, P.C.

(57) ABSTRACT

The present invention relates to an apparatus for stacking semiconductor chips, a method for manufacturing a semiconductor package using the same and a semiconductor package manufactured thereby. The apparatus for stacking semiconductor chips may comprise two tables for supporting wafers, a picker for picking up semiconductor chips and a picker transfer unit for moving the picker vertically and horizontally. The method for manufacturing a semiconductor package using the same may allow easy and rapid stacking of semiconductor chips, thereby improving the productivity of semiconductor package manufacture. Further, a semiconductor chip having a relatively thick film is attached onto another semiconductor chip having a relatively thin film. The thicker semiconductor chip may protect the thinner semiconductor chip from faults such as chipping or warpage which may occur due to external shocks such as that caused by a picker, thereby improving the reliability of the package.

2 Claims, 7 Drawing Sheets

U.S. PATENT DOCUMENTS

| | | | |
|---|---|---|---|
| 6,117,704 | A | 9/2000 | Yamaguchi et al. |
| 6,503,776 | B2 | 1/2003 | Pai et al. |
| 6,514,794 | B2 | 2/2003 | Haba et al. |
| 6,742,561 | B2 | 6/2004 | Nam et al. |
| 6,820,792 | B2 | 11/2004 | Kim et al. |
| 6,847,202 | B2 | 1/2005 | Hwang et al. |
| 6,863,109 | B2 * | 3/2005 | Kim et al. .................. 156/556 |
| 6,882,141 | B2 | 4/2005 | Kim |
| 7,047,632 | B2 * | 5/2006 | Arikado ....................... 29/832 |
| 2002/0070302 | A1 | 6/2002 | Goh |
| 2003/0008476 | A1 | 1/2003 | Hsu et al. |
| 2003/0071338 | A1 | 4/2003 | Jeung et al. |
| 2003/0173949 | A1 | 9/2003 | Hwang |
| 2006/0105477 | A1 * | 5/2006 | Lim et al. ..................... 438/15 |

FOREIGN PATENT DOCUMENTS

| | | |
|---|---|---|
| KR | 1998-034801 | 8/1998 |
| KR | 2002-0012061 | 2/2002 |
| KR | 2002-0058211 | 7/2002 |
| KR | 2002-0086612 | 11/2002 |
| KR | 2003-0008615 | 1/2003 |

OTHER PUBLICATIONS

English language abstract of Japanese Publication No. 2000-188369.

English language abstract of Korean Publication No. 2002-0012061.

English language abstract of Korean Publication No. 2002-0058211.

English language abstract of Korean Publication No. 2002-0086612.

English language abstract of Korean Publication No. 2003-0008615.

* cited by examiner

US 7,374,966 B2

APPARATUS FOR STACKING SEMICONDUCTOR CHIPS, METHOD FOR MANUFACTURING SEMICONDUCTOR PACKAGE USING THE SAME AND SEMICONDUCTOR PACKAGE MANUFACTURED THEREBY

CROSS REFERENCE TO RELATED APPLICATIONS

This is a Divisional of U.S. patent application Ser. No. 10/916,094, filed Aug. 10, 2004, now U.S. Pat. No. 7,135,353, which claims priority under 35 U.S.C. §119 to Korean Patent Application No. 2003-63132, filed Sep. 9, 2003, the contents of which are incorporated by reference.

BACKGROUND OF THE INVENTION

1. Field of the Invention

The present invention relates to an apparatus for stacking semiconductor chips, a method for manufacturing a semiconductor package using the same and a semiconductor package manufactured thereby.

2. Description of the Related Art

The recent trend towards miniaturization of electronic equipment requires high integration density on semiconductor packages. One of the methods for manufacturing high integration density semiconductor packages involves stacking semiconductor chips.

Referring to FIG. 1, the conventional apparatus for stacking semiconductor chips 10 comprises a table 11, a wafer transfer unit 16, a picker 13 and a picker transfer unit 15. The table 11 may be configured to support a first wafer W1 including a plurality of first semiconductor chips 1 and a second wafer W2 including a plurality of second semiconductor chips 2. The wafer transfer unit 16 may be configured to transfer the first and second wafers W1 and W2 to/from the table 11. The picker 13 may be configured to pick up the first semiconductor chip 1. The picker transfer unit 15 may transfer the picker 13.

The first wafer W1 is loaded on the table 11. The picker 13 picks up one first semiconductor chip 1 of the first wafer W1. The first wafer W1 is then unloaded from the table 11. The second wafer W2 is loaded on the table 11. The first semiconductor chip 1 is die-attached on one second semiconductor chip 2 of the second wafer W2. The overall steps are repeated so the plurality of first semiconductor chips 1 vertically stack on the plurality of second semiconductor chips 2.

The conventional apparatus for stacking semiconductor chips has disadvantages of loading/unloading the wafers on/from the wafer table for every stack of the semiconductor chips, thereby increasing the operation time and reducing the productivity of the semiconductor manufacturing process.

Further, when thin semiconductor chips are picked up or die-attached using the vacuum absorption of the picker, faults such as chipping or warpage may occur on the semiconductor chips, leading to the reduced reliability of a semiconductor package.

SUMMARY OF THE INVENTION

The present invention is directed to an improved apparatus for stacking semiconductor chips, a method for manufacturing a semiconductor package using the same and a semiconductor package manufactured thereby.

An apparatus for stacking semiconductor chips may comprise a first table, a picker, a picker transfer unit and a second table. The first table may be configured to support a first wafer including a plurality of first semiconductor chips. The picker may be configured to pick up the first semiconductor chip. The picker transfer unit may be configured to transfer the picker. The second table may be configured to support a second wafer including a plurality of second semiconductor chips and may be spaced apart from the first table.

The picker transfer unit may move the picker horizontally between the first table and the second table and move the picker vertically above each table.

The apparatus for stacking semiconductor chips may further comprise a first wafer transfer unit transferring the first wafer to/from the first table and a second wafer transfer unit transferring the second wafer to/from the second table.

In accordance with an exemplary embodiment of the present invention, a method for manufacturing a semiconductor package may comprise providing a first wafer including a plurality of first semiconductor chips and a second wafer including a plurality of second semiconductor chips. The first and second wafers have first and second adhesive layers formed on the bottom surfaces thereof respectively. The first wafer is loaded on the first table and the second wafer is loaded on the second table spaced apart from the first table. A first semiconductor chip of the first wafer is picked up by the picker and is die-attached on a second semiconductor chip of the second wafer. The die-attaching step repeats to vertical stack a plurality of multi-chips. A first remainder of the first wafer is unloaded from the first table and a substrate panel including a plurality of substrates is then loaded on the first table, The dual chip is picked up by the picker and is die-attached on the substrate. The dual chip may be wire-bonded to the substrate for interconnection. Solder balls may be formed on the bottom surface of the substrate. The substrate panel is singulated.

The first semiconductor chip has a first chip height and a first chip area, or a first active surface area. The second semiconductor chip has a second chip height and a second chip area, or a second active surface area. A first ratio of the first chip area to the first chip height may be smaller than or the same as a second ratio of the second chip area to the second chip height.

The first chip height may be larger than the second chip height and the first chip area may be smaller than the second chip area.

The first ratio may be between 100 mm and 1,000 mm and the second ratio may be between 1,000 mm and 5,000 mm.

In accordance with another exemplary embodiment of the present invention, a method for manufacturing a semiconductor package may comprise providing a first wafer including a plurality of first semiconductor chips and a second wafer including a plurality of second semiconductor chips. The first and second wafers have first and second adhesive layers formed on the bottom surfaces thereof, respectively. The first wafer is loaded on the first table and the second wafer is loaded on the second table. A first semiconductor chip of the first wafer is picked up by the picker and is die-attached on a second semiconductor chip of the second wafer. The first chip die-attaching step is repeated to form a plurality of dual chips configured in a vertical stack. A first remainder of the first wafer is unloaded from the first table and a third wafer including a plurality of third semiconductor chips is then loaded on the first table. The third wafer has a third adhesive layer formed on the bottom surface thereof. The dual chip is picked up by the picker and is die-attached on a third semiconductor chip of the third wafer. The dual chip die-attaching step is repeated to vertically stack a plurality of triple chips. A second remainder of the dual chip is unloaded from the second table. The above overall steps are repeated to form multi-chips. A substrate panel including a plurality of substrates is loaded on any table where the multi-chips are not loaded. The multi-chip is picked up by the picker and is die-attached on the substrate. The multi-chip is wire-bonded to the substrate for interconnection. Solder balls are formed on the bottom surface of the substrate. The substrate panel is singulated.

The upper semiconductor chip has a third chip height and a third chip area, or a third active surface area and the lower semiconductor chip has a fourth chip height and a fourth chip area, or a fourth active surface area, when two adjacent semiconductor chips are selected from the multi-chip. A third ratio of the third chip area to the third chip height may be smaller than or the same as a fourth ratio of the fourth chip area to the fourth chip height.

The third chip area may be smaller than the fourth chip area.

In accordance with still another exemplary embodiment of the present invention, a method for manufacturing a semiconductor package may comprise providing a first interposer panel including a plurality of interposers and a first wafer including a plurality of first semiconductor chips. The first interposer panel and the first wafer have first and second adhesive layers formed on the bottom surfaces thereof, respectively. The first interposer panel may be loaded on the first table and the first wafer may be loaded on the second table. The first table may be spaced apart from the second table. A first interposer of the first interposer panel may be picked up by the picker and may be die-attached on a first semiconductor chip of the first wafer. The first interposer die-attaching step may be repetitively performed to form at least one first semiconductor chip set having a vertical stack configuration. The first interposer panel may be unloaded from the first table and a substrate panel including a plurality of substrates may be then loaded on the first table. The first semiconductor chip set may be picked up by the picker and may be die-attached on the substrate. The substrate panel may be unloaded from the first table and the remainder of the first semiconductor chip set may be unloaded from the second table. A second semiconductor chip set may be formed through the same steps as the first semiconductor chip set. A second semiconductor chip may be the same as the first semiconductor chip and a second interposer may be the same as the first interposer. The first semiconductor chip may be wire-bonded to the substrate for interconnection. The second semiconductor chip set may be die-attached on the first semiconductor chip set. A second semiconductor chip of the second semiconductor chip set may be wire-bonded to the substrate for interconnection. A third semiconductor chip being the same as the second semiconductor chip may be die-attached on the second semiconductor chip set. The third semiconductor chip may be wire-bonded to the substrate for interconnection. Solder balls may then be formed on the bottom surface of the substrate. The substrate panel is singulated.

A semiconductor package may comprise a first semiconductor chip, a second semiconductor chip set including at least one semiconductor chip, a substrate having the second semiconductor chip set attached on the top surface thereof, solder balls formed on the bottom surface of the substrate and bonding wires electrically connecting the first semiconductor chip and a second semiconductor chip of the second semiconductor chip set to the substrate. The first semiconductor chip can have a first chip height and a first chip area, or a first active surface area. The second semiconductor chip can have a second chip height and a second chip area, or a second active surface area. A first ratio of the first chip area to the first chip height may be smaller than a second ratio of the second chip area to the second chip height.

The first ratio may be between 100 mm and 1,000 mm and the second ratio may be between 1,000 mm and 5,000 mm.

The first chip height may be larger than the second chip height.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements, and in which.

DETAILED DESCRIPTION OF THE INVENTION

Exemplary embodiments of the present invention will be described below with reference to the accompanying drawings.

Figure 1:
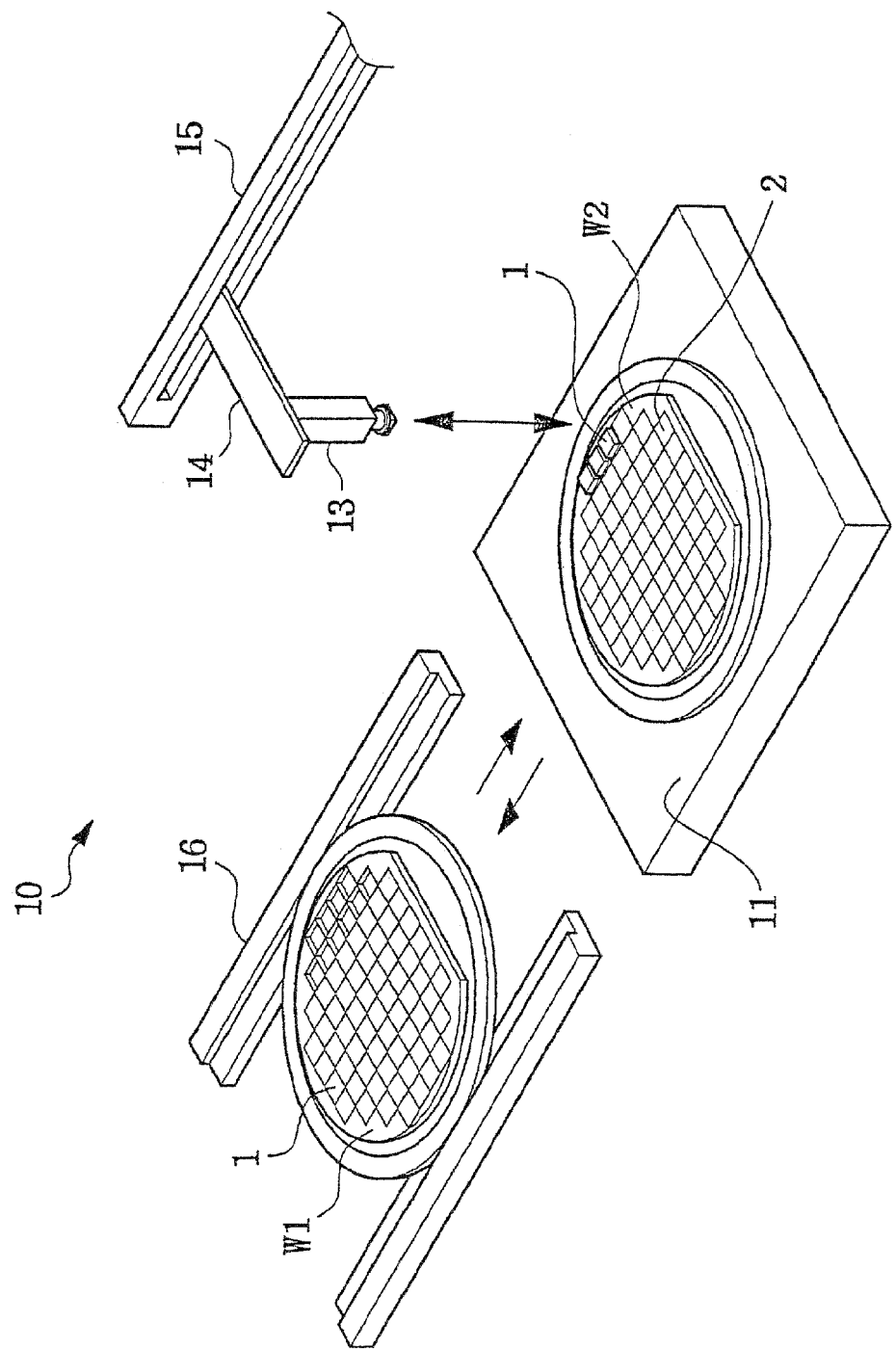
FIG. 1 is a schematic perspective view of a conventional apparatus for stacking semiconductor chips.
Figure 2:
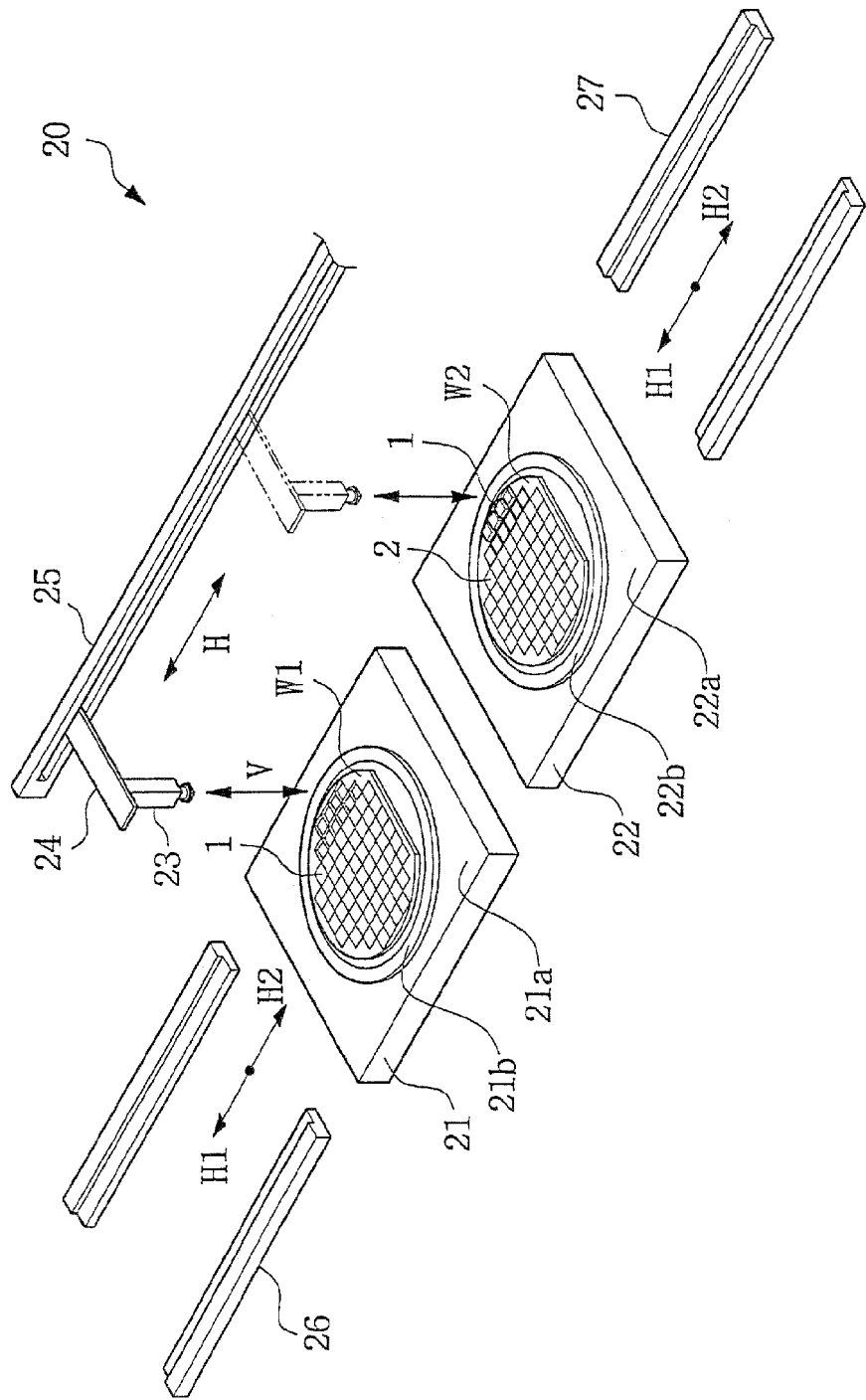
FIG. 2 is a schematic perspective view of an apparatus for stacking semiconductor chips in accordance with an exemplary embodiment of the present invention.

Referring to FIG. 2, the apparatus for stacking semiconductor chips comprises a first table 21 and a second table 22, a first wafer transfer unit 26 and a second wafer transfer unit 27, a picker 23 and a picker transfer unit 25.

The first table 21 supports a first wafer W1 including a plurality of first semiconductor chips 1. The second table 22 supports a second wafer W2 including a plurality of second semiconductor chips 2. The second table 22 is spaced apart from the first table 21. The first wafer W1 and the second wafer W2 may be loaded on a first wafer support 21b and a second wafer support 22b, respectively.

The first wafer transfer unit 26 loads/unloads the first wafer W1 on/from the first table 21. The second wafer transfer unit 27 loads/unloads the second wafer W2 on/from the second table 22, The first and second wafer transfer units 26 and 27 may include a guide rail or an elevator device.

The picker 23 picks up a first semiconductor chip 1. The picker 23 is supported by a picker support 24 connected to the picker transfer unit 25. The picker 23 may include a vacuum absorption picker using vacuum pressure.

The picker transfer unit 25 transfers the picker 23 between the first table 21 and the second table 22. In an embodiment the picker 23 may be transferred in a horizontal movement (H). The picker transfer unit 25 also transfers the picker 23 upward and downward over the first and second tables 21 and 22 in a vertical movement (V).

FIGS. 3a through 3e are cross-sectional views of a method for manufacturing a semiconductor package using the apparatus for stacking semiconductor chips in accordance with an exemplary embodiment of the present invention.

A first wafer and a second wafer (W1 and W2 of FIG. 2) are provided. The first wafer W1 includes a plurality of first semiconductor chips 1. The second wafer W2 includes a plurality of second semiconductor chips 2. The first wafer W1 has a first adhesive layer (31 of FIG. 3a) formed on the lower surface thereof and the second wafer W2 has a second adhesive layer (32 of FIG. 3b) formed on the lower surface thereof. A first adhesive tape (33 of FIG. 3a) is formed on the bottom surface of the first adhesive layer 31. A second adhesive tape (34 of FIG. 3b) is formed on the bottom surface of the second adhesive layer 32.

As shown in FIG. 2, the first wafer W1 is moved in the direction H2 to be loaded on the first table 21. The second wafer W2 is moved in the direction H1 to be loaded on the second table 22.

Figure 3A:
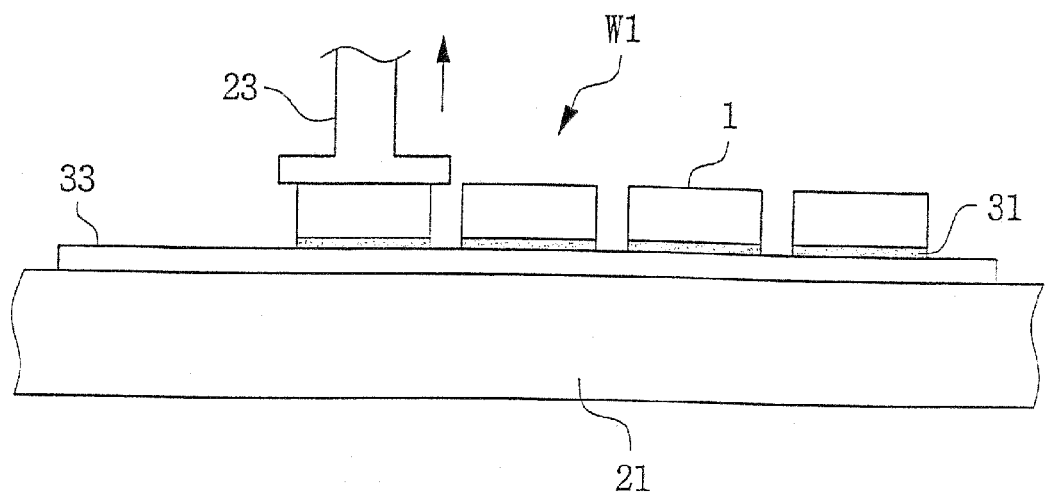
FIGS. 3a through 3e are cross-sectional views of a method for manufacturing a semiconductor package using the apparatus for stacking semiconductor chips in accordance with an exemplary embodiment of the present invention.

Referring to FIG. 3a, a first semiconductor chip 1 of the first wafer W1 is picked up by the picker 23.

Figure 3B:
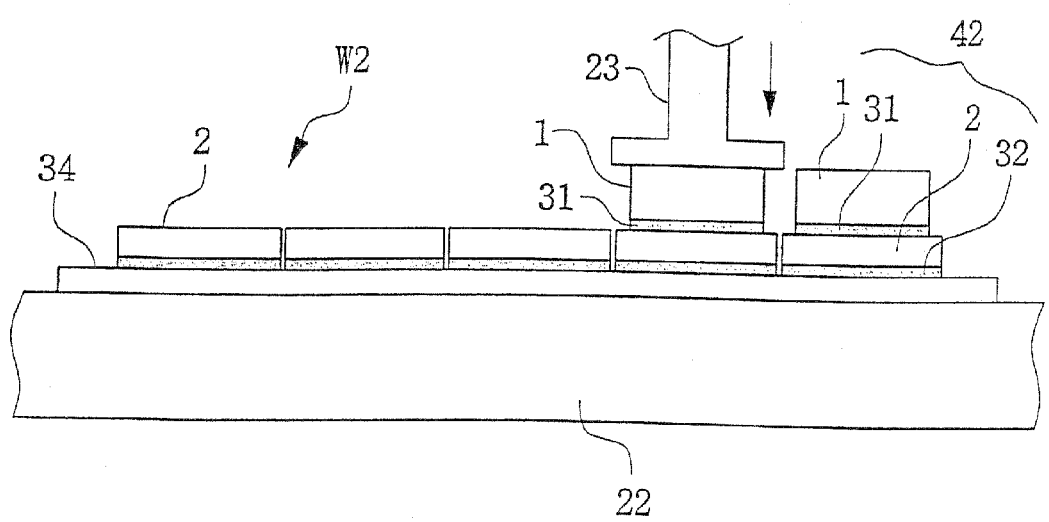

Referring to FIG. 3b, the first semiconductor chip 1 is die-attached on a second semiconductor chip 2 by the picker 23. This step is repeated to form a plurality of multi-chips 42 having vertical stack configurations. The multi-chips may be dual chips, triple chips, or any other multiple of single chips.

Figure 4:
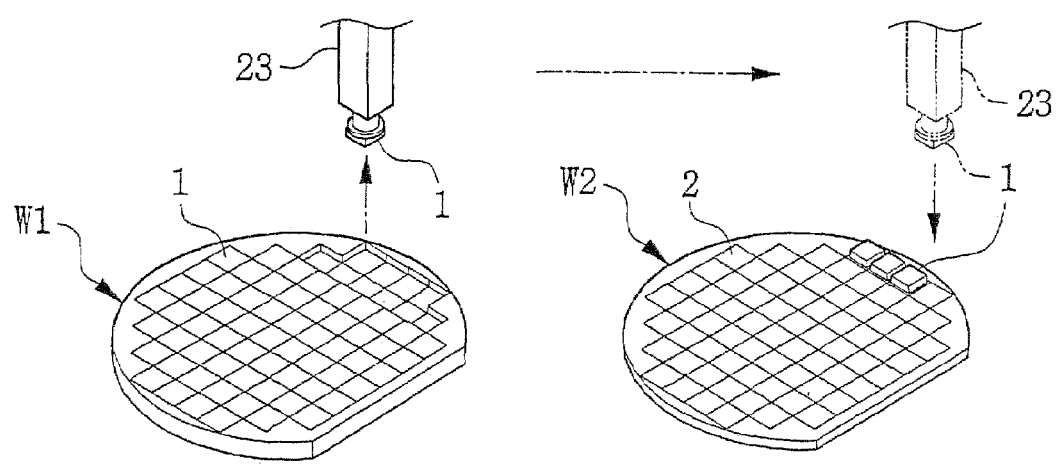
FIG. 4 is a perspective view illustrating the stacking of semiconductor chips.

Referring to FIG. 4, the first semiconductor chip 1 may be an 8 mm×8 mm×100μm chip (length×width×height) and the second semiconductor chip 2 may be a 10 mm×10 mm×30μm chip (length×width×height).

Referring back to FIG. 2, a first remainder (not shown) of the first wafer W1 is unloaded from the first table 21. A substrate panel (35 of FIG. 3d) including a plurality of substrates (36 of FIG. 3d) is then loaded on the first table 21.

Figure 3C:
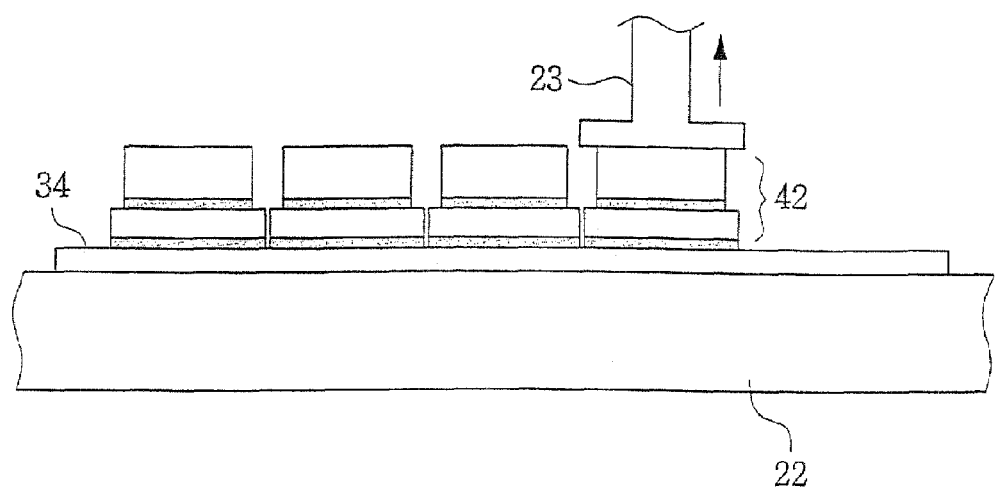

Referring to FIG. 3c, the multi-chip 42 is picked up by the picker 23.

Figure 3D:
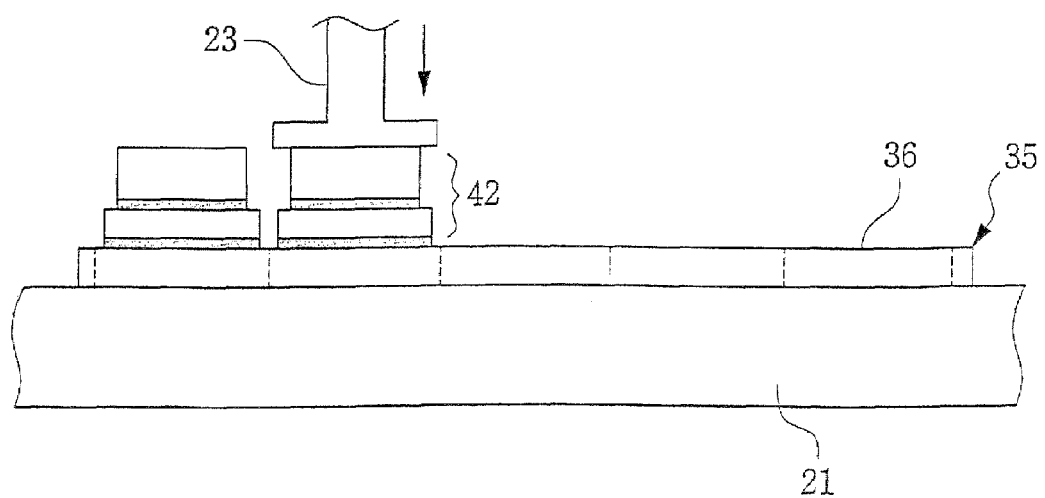

Referring to FIG. 3d, the multi-chip 42 is then die-attached on the substrate 36.

Figure 3E:
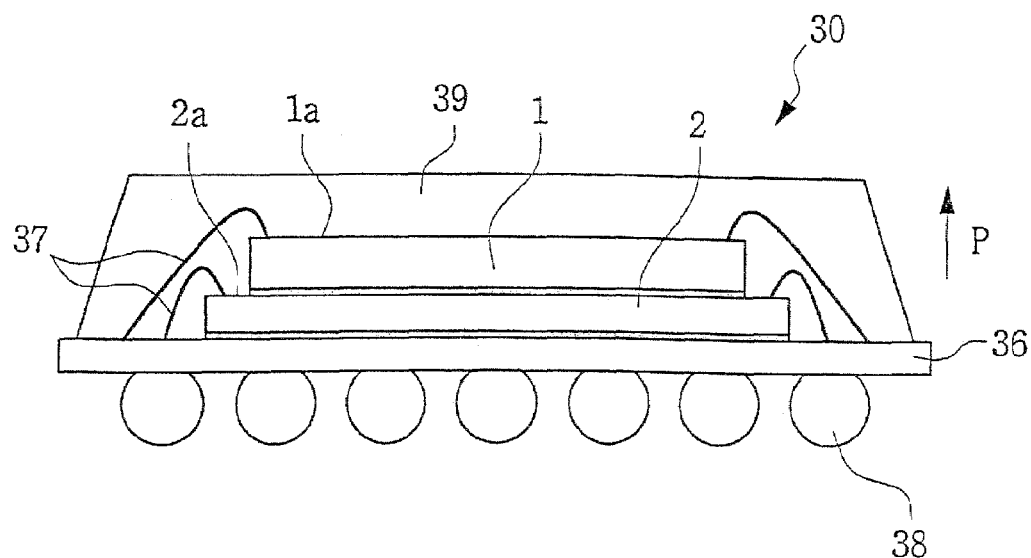

Referring to FIG. 3e, bonding wires 37 are attached between the multi-chip 42 and the substrate 36 to electrically connect the multi-chip 42 and the substrate 36. Solder balls 38 are formed on the bottom surface of the substrate 36. The substrate panel (35 of FIG. 3d) is singulated. An encapsulant 39 seals the top surface of the substrate 36, and the multi-chip 42 and the bonding wires 37. In this way, the manufacture of a semiconductor package 30 is completed.

The first semiconductor chip 1 has a first chip height measured in a normal direction (P) and a first chip area, or a first active surface (1a) area. The second semiconductor chip 2 has a second chip height measured in a normal direction (P) and a second chip area, or a second active surface (2a) area.

A first ratio of the first chip area to the first chip height may be smaller than or the same as a second ratio of the second chip area to the second chip height.

The first height may be larger than the second height and the first chip area may be smaller than the second chip area. The first ratio may be between 100 mm and 1,000 mm and the second ratio may be between 1,000 mm and 5,000 mm.

Although this embodiment shows the multi-chips in which two semiconductor chips are vertically stacked, three semiconductor chips or more may be vertically stacked.

Figure 5:
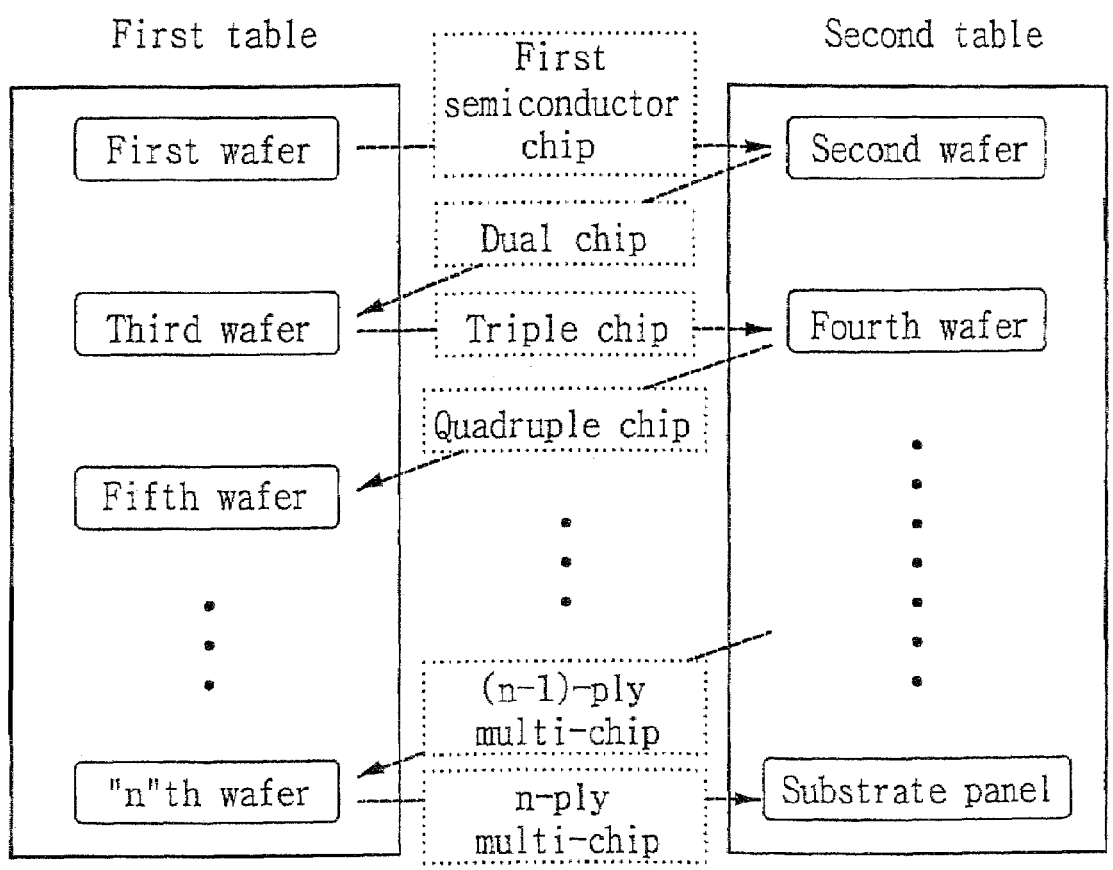
FIG. 5 is a schematic diagram illustrating the stacking of a plurality of semiconductor chips.

Referring to FIG. 5, a first wafer including a plurality of first semiconductor chips is loaded on a first table. A second wafer including a plurality of second semiconductor chips is loaded on a second table. A first semiconductor chip may be die-attached on a second semiconductor chip to form a dual chip. A first remainder of the first wafer is unloaded from the first table. A third wafer including a plurality of third semiconductor chips is loaded on the first table. The dual chip is die-attached on a third semiconductor chip to form a triple chip. A second remainder of the second wafer is unloaded from the second table. A fourth wafer including a plurality of fourth semiconductor chips is loaded on the second table. The triple chip is die-attached on a fourth semiconductor chip to form a quadruple chip. In this way, a "n−1"th semiconductor chip of a "n−1"th wafer is die-attached on a "n−1"th semiconductor chip to form a n-ply multi-chip. Here "n" is a natural number of two or more. Although FIG. 5 shows that the "n"th wafer including the "n"th semiconductor chip is loaded on the first table, the "n"th wafer including the "n"th semiconductor chip may be loaded on the second table.

Accordingly, a method for manufacturing a semiconductor package using an apparatus for stacking semiconductor chips in accordance with the present invention may achieve easy and rapid stacking of semiconductor chips.

The second semiconductor chip has a relatively thin film of about 30μm, while the first semiconductor chip has a relatively thick film of about 100μm and a chip area sufficient to prevent faults from external shocks. The first semiconductor chip may protect the second semiconductor chip from faults such as chipping or warpage which may occur due to external shocks such as that caused by a picker.

Figure 6:
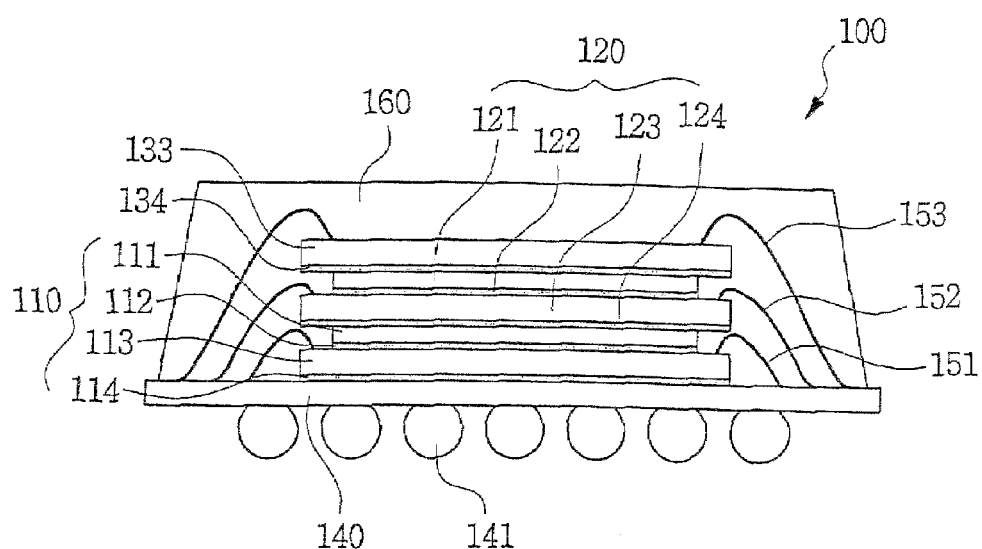
FIG. 6 is a cross-sectional view of a semiconductor package in accordance with another exemplary embodiment of the present invention.

FIG. 6 is a cross-sectional view of a semiconductor package in accordance with another exemplary embodiment of the present invention.

Referring to FIG. 6, a semiconductor package 100 has a same-die stack configuration. The semiconductor package 100 comprises a first semiconductor chip 113, a second semiconductor chip 123, a third semiconductor chip 133, a first interposer 111, a second interposer 121, a first bonding wire 151, a second bonding wire 152, a third bonding wire 153 and an encapsulant 160.

A substrate 140 has solder balls 141 formed on the bottom surface thereof. The first, second and third semiconductor chips 113, 123 and 133 are stacked on the substrate 140. The first, second and third semiconductor chips 113, 123 and 133 have second, fourth and fifth adhesive layers 114, 124 and 134 on the back surfaces thereof, respectively. The first, second and third semiconductor chips 113, 123 and 133 have substantially equal sizes. The first and second interposers 111 and 121 have first and third adhesive layers 112 and 122 formed on the bottom surfaces thereof, respectively. The first interposer 111 interposes between the first semiconductor chip 113 and second semiconductor chip 123. The second interposer 121 interposes between the second semiconductor chip 123 and third semiconductor chip 133. The first, second and third bonding wires 151,152 and 153 electrically connect the first, second and third semiconductor chips 113, 123 and 133 to the substrate 140, respectively. The encapsulant 160 seals the top surface of the substrate 140, the first, second and third semiconductor chips 113, 123 and 133, and the first, second and third bonding wires 151, 152 and 153.

A first semiconductor chip set 110 comprises the first interposer 111 having the first adhesive layer 112, and the first semiconductor chip 113 having the second adhesive layer 114. A second semiconductor chip set 120 comprises the second interposer 121 having the third adhesive layer 122, and the second semiconductor chip 123 having the fourth adhesive layer 124.

An exemplary method for manufacturing the semiconductor package 100 comprises loading a first interposer panel (not shown) on the first table (21 of FIG. 2). A first wafer (not shown) is loaded on the second table 22.

A first interposer 111 is picked up by the picker (23 of FIG. 2) and is die-attached on a first semiconductor chip 113 to form a first semiconductor chip set 110.

The first interposer panel is unloaded from the first table (21 of FIG. 2). The substrate panel (not shown) including the substrate 140 is loaded on the first table (21 of FIG. 2).

The first semiconductor chip set 110 is picked up by the picker (23 of FIG. 2) and is die-attached on the substrate 140.

The substrate panel is unloaded from the first table (21 of FIG. 2). The remainder of the first semiconductor chip set 110 is unloaded from the second table (22 of FIG. 2).

The second semiconductor chip set 120 is formed through the same processes as the first semiconductor chip set 110. A second wafer is the same as the first wafer and a second interposer 121 is the same as the first interposer 111.

The first semiconductor chip 113 is electrically connected to the substrate 140 by a first bonding wire 151.

The second semiconductor chip set 120 is die-attached on the first semiconductor chip set 110. At this time, the apparatus for stacking semiconductor chips (20 of FIG. 2) may be used.

The second semiconductor chip 123 is electrically connected to the substrate 140 by a second bonding wire 152.

A third semiconductor chip 133, similar to the second semiconductor chip, is die-attached on the semiconductor chip set 120. The apparatus for stacking semiconductor chips (20 of FIG. 2) may then be used.

The third semiconductor chip 133 is electrically connected to the substrate 140 by a third bonding wire 153.

Solder balls 140 are formed on the bottom surface of the substrate 140. An encapsulant 160 is formed. The substrate panel is singulated.

Although this embodiment shows that the semiconductor package 100 comprises three semiconductor chips and two interposers, the present invention may have variations in the number of semiconductor chips and interposers.

Figure 7:
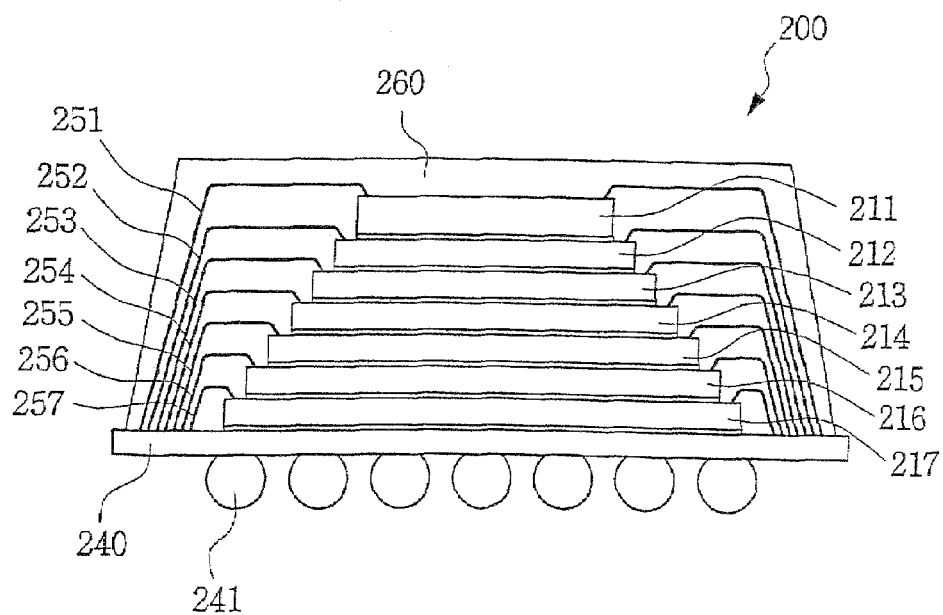
FIG. 7 is a cross-sectional view of a semiconductor package in accordance with still another exemplary embodiment of the present invention.

Referring to FIG. 7, a semiconductor package 200 comprises a substrate 240, first to seventh semiconductor chips 211 to 217, first to seventh bonding wires 251 to 257 and an encapsulant 260.

The substrate 240 has solder balls 241 formed on the bottom surface thereof. The first to seventh semiconductor chips 211 to 217 are stacked on the substrate 240. The first semiconductor chip 211 may be a 8 mm×8 mm×100 μm chip (length×width×height) and the second semiconductor chip 212 may be a 10 mm×10 mm×30 μm chip (length×width×height). The third to seventh semiconductor chips 213 to 217 may all have equal thickness, but the upper semiconductor chip may be smaller in chip area than a lower semiconductor chip. The first to seventh bonding wires 251 to 257 electrically connect the first to seventh semiconductor chips 211 to 217 to the substrate 240, respectively. The encapsulant 260 seals the top surface of the substrate 240, the first to seventh semiconductor chips 211 to 217 and the first to seventh bonding wires 251 to 257.

When two adjacent semiconductor chips are selected from the first to seventh semiconductor chips 211 to 217, the upper semiconductor chip has a first chip height and a first chip area and the lower semiconductor chip has a second chip height and a second chip area. A first ratio of the first chip area to the first chip height may be smaller than a second ratio of the second chip area to the second chip height. Specifically, the first semiconductor chip 211 is a 8 mm×8 mm×100 μm chip (length×width×height) and the second semiconductor chip 212 is a 10 mm×10 mm×30 μm chip (length×width×height). The first ratio is 640 mm and the second ratio is about 3,333 mm. Therefore, the first ratio is smaller than the second ratio.

The first ratio may be between 100 mm and 1,000 mm and the second ratio may be between 1,000 mm and 5,000 mm. The upper semiconductor chip may be thicker than the lower semiconductor chip.

In accordance with the present invention, an apparatus for stacking semiconductor chips may comprise two tables supporting wafers, a picker picking up semiconductor chips and a picker transfer unit moving the picker vertically and horizontally. A method for manufacturing a semiconductor package using such an apparatus for stacking semiconductor chips may allow easy and rapid stacking of semiconductor chips, thereby improving the productivity of semiconductor package manufacture.

Further, a semiconductor chip having a relatively thick film is die-attached on another semiconductor chip having a relatively thin film. The thicker semiconductor chip may protect the thinner semiconductor chip from faults such as chipping or warpage which may occur due to external shocks such as that caused by a picker, thereby improving the reliability of the package.

Although the exemplary embodiments of the present invention have been described in detail, it should be understood that many variations and/or modifications of the basic inventive concepts herein taught, which may appear to those skilled in the art, will still fall within the spirit and scope of the present invention as defined in the appended claims.

What is claimed is:

1. An apparatus for stacking semiconductor chips, the apparatus comprising:
    a first table to support a first wafer including a plurality of first semiconductor chips;
    a picker to pick up a first semiconductor chip;
    a picker transfer unit to move the picker;
    a second table to support a second wafer including a plurality of second semiconductor chips;
    a first wafer transfer unit to load the first wafer on the first table; and
    a second wafer transfer unit to load the second wafer on the second table.

2. The apparatus of claim 1, wherein the picker transfer unit can horizontally move the picker between the first table and second table.

* * * * *

UNITED STATES PATENT AND TRADEMARK OFFICE
CERTIFICATE OF CORRECTION

PATENT NO. : 7,374,966 B2
APPLICATION NO. : 11/534924
DATED : May 20, 2008
INVENTOR(S) : Min-Ill Kim et al.

It is certified that error appears in the above-identified patent and that said Letters Patent is hereby corrected as shown below:

Column 2, line 32, the words "table, The" should read -- table. The --;
Column 4, line 60, the words "22, The" should read -- 22. The --;
Column 6, line 16, the words "n-1"th"" should read -- "n"th --;
Column 6, line 58, the word "151,152" should read -- 151, 152 --.

Signed and Sealed this

Nineteenth Day of August, 2008

JON W. DUDAS
*Director of the United States Patent and Trademark Office*